(12) United States Patent
Park et al.

(10) Patent No.: US 7,986,169 B2
(45) Date of Patent: Jul. 26, 2011

(54) COMPARATOR CIRCUIT FOR COMPARING THREE INPUTS

(75) Inventors: Sung-Min Park, Nowon-gu (KR); Seok-Hoon Bang, Yongin-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 42 days.

(21) Appl. No.: 12/642,088

(22) Filed: Dec. 18, 2009

(65) Prior Publication Data

US 2010/0164627 A1 Jul. 1, 2010

(30) Foreign Application Priority Data

Dec. 30, 2008 (KR) ........................ 10-2008-0137259

(51) Int. Cl.
*H03K 5/22* (2006.01)
(52) U.S. Cl. ................. 327/65; 327/67; 327/71
(58) Field of Classification Search .............. 327/63–71, 327/560–563
See application file for complete search history.

(56) References Cited

U.S. PATENT DOCUMENTS

| | | | | |
|---|---|---|---|---|
| 6,759,887 | B2 * | 7/2004 | Takahashi et al. | 327/359 |
| 7,358,776 | B2 * | 4/2008 | Matsumoto | 327/18 |
| 2003/0128056 | A1 * | 7/2003 | Nilson et al. | 327/65 |

* cited by examiner

*Primary Examiner* — Quan Tra
(74) *Attorney, Agent, or Firm* — Sherr & Vaughn, PLLC

(57) ABSTRACT

A comparator circuit. A comparator circuit may include a differential amplifying unit to amplify a difference between a voltage at a first node and a voltage at a second node and/or output a resultant voltage, and/or a current source to supply a first bias current to a first node and/or supply a second bias current to a second node. A comparator may include a first bias switch to bias a current flowing from a first node to a ground voltage source, a second bias switch to bias a part of a current flowing from a second node to a ground voltage source, a third bias switch to bias a remaining part of a current flowing from a second node to a ground voltage source, and/or a bias converting unit to supply a third bias current to a second node.

20 Claims, 3 Drawing Sheets

| NO | Comp1 | Comp2 | Condition | Equation | Switch |
|---|---|---|---|---|---|
| 1 | Low | High | $V2 < \beta V3$ & $\alpha V2 > V3$ | $\frac{1}{\beta} < \frac{V3}{V2} < \alpha$ | 정의 X |
| 2 | High | Low | $V2 < \beta V3$ & $\alpha V2 > V3$ | $\alpha < \frac{V3}{V2} < \frac{1}{\beta}$ | ON |
| 3 | High | High | $V2 < \beta V3$ & $\alpha V2 > V3$ | $\frac{V3}{V2} < \alpha$ and $\cancel{\frac{1}{\beta}}$ | OFF |
| 4 | Low | Low | $V2 < \beta V3$ & $\alpha V2 > V3$ | $\cancel{\alpha}$ and $\frac{1}{\beta} < \frac{V3}{V2}$ | OFF |

US 7,986,169 B2

COMPARATOR CIRCUIT FOR COMPARING THREE INPUTS

The present application claims priority under 35 U.S.C. 119 to Korean Patent Application No. 10-2008-0137259 (filed on Dec. 30, 2008) which is hereby incorporated by reference in its entirety.

BACKGROUND

Embodiments relate to a comparator circuit and methods thereof. Some embodiments relate to a comparator circuit which may compare three inputs.

Figure 1:
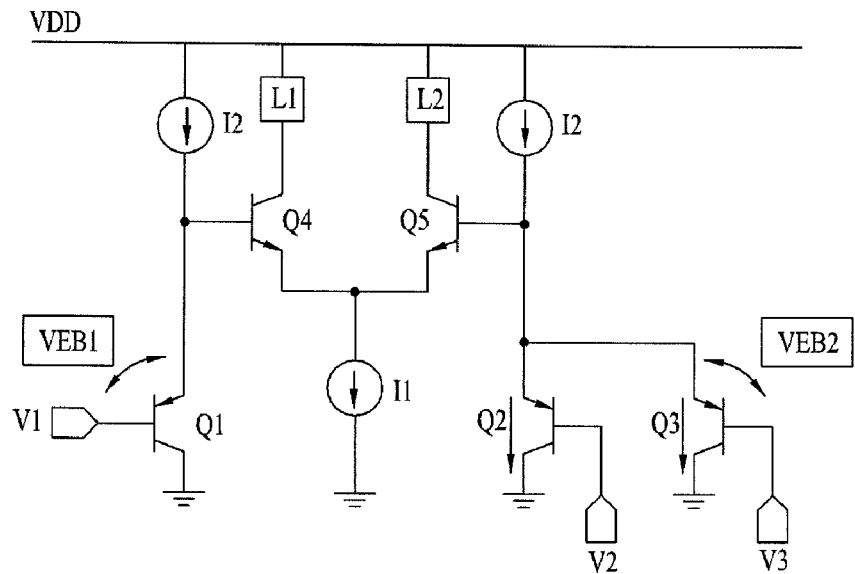

A high-performance integrated circuit (IC) internally may use at least one comparator to achieve precise control and/or other various functions. Such a comparator may include two inputs. To achieve relatively more complex functions, a 3-input comparator may be used. Example FIG. 1 illustrates comparator circuit 100 to compare three inputs. Referring to FIG. 1, 3-input comparator circuit 100 may compare voltage V1 of a first signal with a lower one of voltage V2 of a second signal and/or voltage V3 of a third signal. Further, 3-input comparator circuit 100 may output a result of a comparison.

Voltage V2 of a second signal may be fixed and/or voltage V3 of a third signal may be increased from 0. When voltage V3 of a third signal may have a value within a range between 0 and voltage V2 of a second signal, voltage V1 of a first signal may be compared with voltage V3 of a third signal. On the other hand, when voltage V3 of a third signal may be higher than voltage V2 of a second signal, voltage V1 of a first signal may be compared with voltage V2 of a third signal. In accordance with results of a comparison, an output of a comparator circuit may be determined.

Comparator circuit 100 of FIG. 1, which may compare three inputs, may not achieve accurate comparison when voltage V3 of a third signal may be approximately equal to voltage V2 of a second signal. When the difference between voltage V3 of a third signal and voltage V2 of a second signal is relatively large, only one of second transistor Q2 and third transistor Q3 may be turned on. In this case, comparator circuit 100 may normally operate because second bias current I2 may flow through only one of second transistor Q2 and third transistor Q3, namely, through only a turned-on transistor. However, the difference between voltage V3 of a third signal and voltage V2 of a second signal may be relatively small, such that both second transistor Q2 and third transistor Q3 may be turned on. In this case, half of a second bias current I2 may flow through each of second transistor Q2 and third transistor Q3.

An offset between first emitter-base voltage VEB1 and second emitter-base voltage VEB2 may relatively increase. Since second bias current I2 may be divided into two completely-equal parts, an offset may correspond to VT×ln(2) (VEB1−VEB2=VT×ln(2)), where VT may reference a temperature constant and/or ln may reference a natural logarithm. Where half of second bias current I2 flows through each emitter node of each of second transistor Q2 and third transistor Q3, there may be an offset of VT×ln(2). If VT is approximately 25 mV, an offset may be approximately 17.3 mV. N transistors, for example n being a natural number greater than 2, may be used and/or an offset may increase to VT×ln(n).

Accordingly, there is a need of a comparator circuit and methods thereof which may compare three inputs, which may be capable of securing relatively precise operation and/or which may achieve an enhancement in an operation range.

SUMMARY

Embodiments relate to a comparator circuit and methods thereof. Some embodiments relate to a comparator circuit and methods thereof which may compare three inputs. According to embodiments, a comparator circuit may compare three inputs, may be capable of securing relatively precise operation, and/or may achieve an enhancement in operation range.

According to embodiments, a comparator circuit may include a differential amplifying unit which may amplify a difference between a voltage at a first node and a voltage at a second node, and/or output a resultant voltage. In embodiments, a comparator circuit may include a current source which may supply a first bias current to a first node, and/or supply a second bias current to a second node. In embodiments, a comparator circuit may include a first bias switch which may bias a current flowing from a first node to a ground voltage source, for example based on a first voltage. In embodiments, a comparator circuit may include a second bias switch which may bias a part of a current flowing from a second node to a ground voltage source, for example based on a second voltage. In embodiments, a comparator circuit may include a third bias switch which may bias a remaining part of a current flowing from a second node to a ground voltage source, for example based on a third voltage.

According to embodiments, a comparator circuit may include a bias converting unit which may supply a third bias current to a second node, for example based on a second voltage and/or a third voltage. In embodiments, a first bias current and a second bias current may have substantially the same value. In embodiments, a bias converting unit may supply a third bias current to a second node when a second voltage and/or a third voltage are within a predetermined range.

According to embodiments, a comparator circuit may include a differential amplifying unit which may amplify a difference between a voltage at a first node and a voltage at a second node, and/or output a resultant voltage. In embodiments, a comparator circuit may include a first bias switch which may control a current flowing to a ground voltage source, for example from a first node, to which a first current may be supplied, for example based on a first voltage. In embodiments, a comparator circuit may include a second bias switch which may control a part of a current flowing to a ground voltage source, for example from a second node, to which a second current may be supplied, for example based on a second voltage. In embodiments, a comparator circuit may include a third bias switch which may control a remaining part of a current flowing from a second node to a ground voltage source, for example based on a third voltage. In embodiments, a comparator circuit may include a bias converting unit which may supply a third bias current to a second node, for example based on a second voltage and/or a third voltage.

According to embodiments, a first bias switch may include a bipolar transistor connected between a first node and a ground voltage source while having a first base, to which a first voltage may be applied. In embodiments, a second bias switch may include a bipolar transistor connected between a second node and a ground voltage source while having a second base, to which a second voltage may be applied. In embodiments, a third bias switch may include a bipolar transistor connected between a second node and a ground voltage source while having a third base, to which a third voltage may be applied.

According to embodiments, switches and/or logic circuits may be added to a 3-input comparator in accordance with embodiments. In embodiments, bias currents may be changed in accordance with an input voltage. In embodiments, an operation range and/or accuracy may be maximized.

DRAWINGS

Example FIG. 1 is a circuit diagram illustrating a comparator circuit to compare three inputs.

Figure 2:
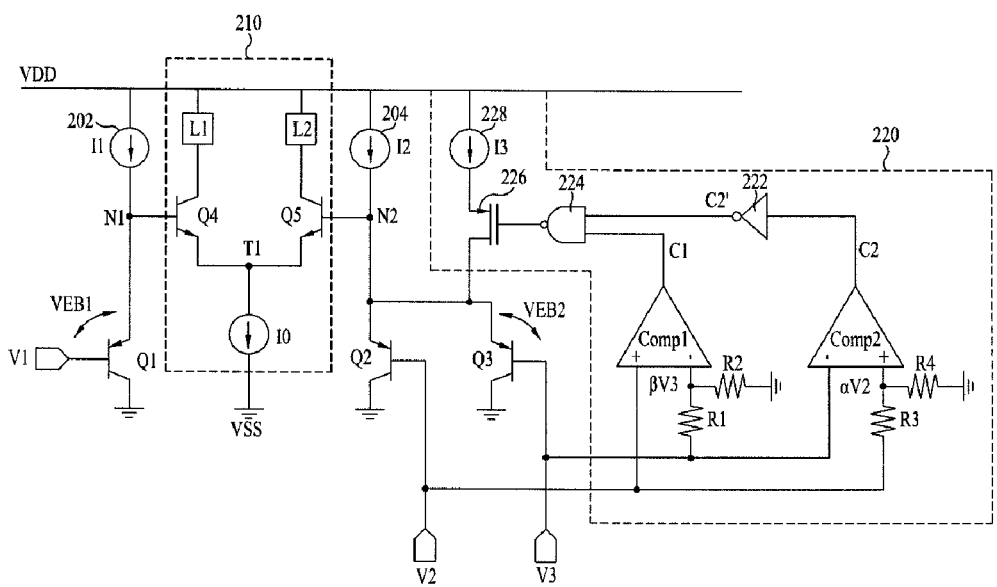

Example FIG. 2 is a circuit diagram illustrating a comparator circuit which may compare three inputs in accordance with embodiments.

Figures 3, 4:
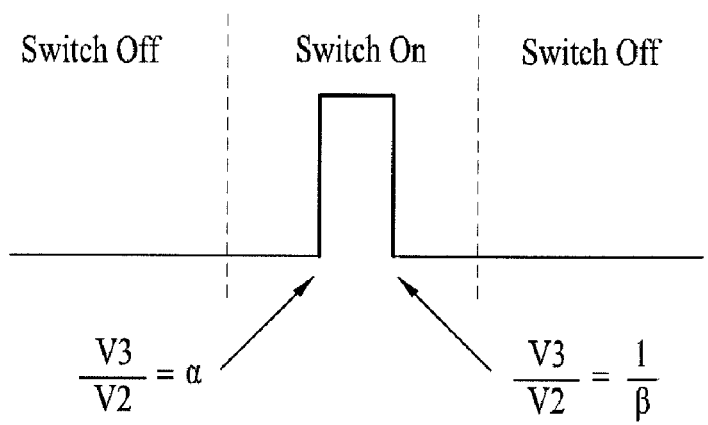

Example FIG. 3 is a table illustrating output states of first and second comparators, and a bias converting transistor as illustrated in FIG. 2 in accordance with embodiments.

Example FIG. 4 is a waveform diagram illustrating an ON-OFF operation range of a bias converting transistor according to second and third voltages in accordance with embodiments.

Figure 5:
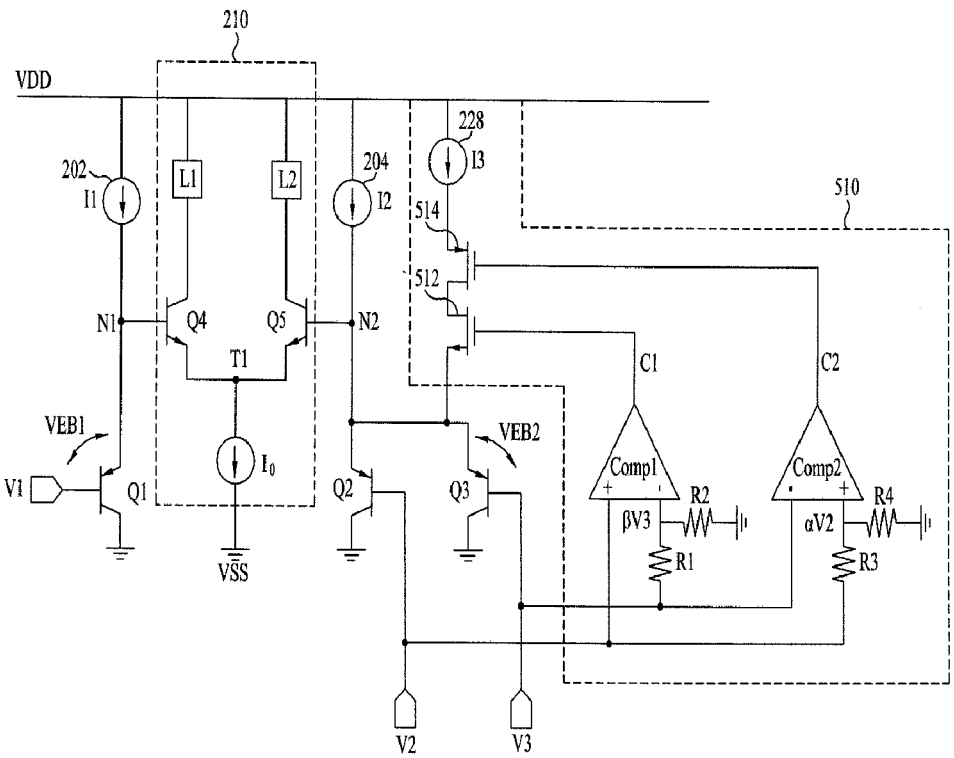

Example FIG. 5 is a circuit diagram illustrating a comparator circuit which may compare three inputs in accordance with embodiments.

Figure 6:
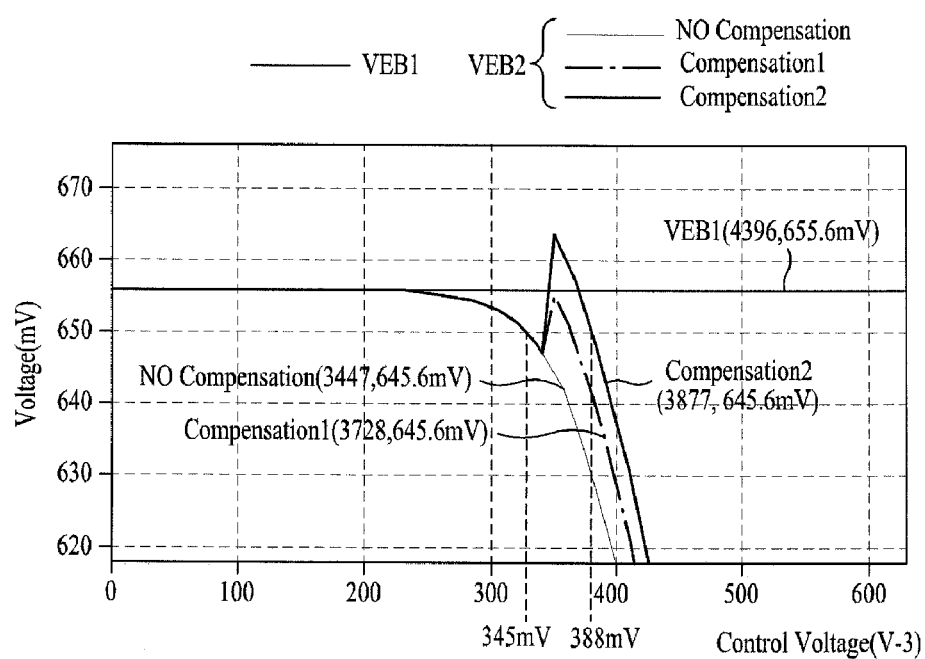

Example FIG. 6 is a graph depicting variations in first and third emitter-base voltages according to a variation in a third voltage in accordance with embodiments.

DESCRIPTION

Embodiments relate to a comparator circuit and methods thereof. Example FIG. 2 is a circuit diagram illustrating a comparator circuit which may compare three inputs in accordance with embodiments. Referring to FIG. 2, 3-input comparator circuit 200 may include first bias current source 202, second bias current source 204, first bias switch Q1, second bias switch Q2, third bias switch Q3, differential amplifying unit 210, and/or bias converting unit 220.

According to embodiments, first bias switch Q1 may be connected between first input node N1 of differential amplifying unit 210 and first voltage source VSS. In embodiments, first bias switch Q1 may be switched in response to first voltage V1. In embodiments, first bias switch Q1 may be a bipolar transistor having a first base to which first voltage V1 may be input, a first emitter connected to first node N1 and/or a first collector connected to first voltage source VSS. In embodiments, first voltage source VSS may be a ground voltage source.

According to embodiments, second bias switch Q2 may be connected between second input node N2 of differential amplifying unit 210 and first voltage source VSS. In embodiments, second bias switch Q2 may be switched in response to second voltage V2. In embodiments, second bias switch Q2 may be a bipolar transistor having a second base to which second voltage V2 may be input, a second emitter connected to second node N2 and/or a second collector connected to first voltage source VSS.

According to embodiments, third bias switch Q3 may be connected between second input node N2 of differential amplifying unit 210 and first voltage source VSS. In embodiments, third bias switch Q3 may be switched in response to a third voltage V3. In embodiments, third bias switch Q3 may be a bipolar transistor having a third base to which third voltage V3 may be input, a third emitter connected to second node N2 and/or a third collector connected to the first voltage source VSS.

According to embodiments, first bias current source 202 may be connected between first node N1 and second voltage source VDD, which may supply first current I2 to first node N1. In embodiments, second bias current source 204 may be connected between second node N2 and second voltage source VDD, which may supply second current I2 to second node N2. In embodiments, first current I1 may have substantially the same value as second current I2, for example I1=I2.

According to embodiments, differential amplifying unit 210 may include output load L1, output load L2, differential amplifier Q4, differential amplifier Q5, and/or input bias current source 10. In embodiments, each of output load L1 and/or L2 may be connected between a corresponding output terminal of differential amplifiers Q4, Q5 and/or second voltage source VDD. In embodiments, each output load L1 and L2 may be realized by a transistor as an active load and/or a current mirror. In embodiments, input bias current source 10 may be connected between tail T1 of differential amplifiers Q4, Q5 and/or first voltage source VSS. In embodiments, bias converting unit 220 may supply third current I3 to second node N2 when a ratio of third voltage V3 to second voltage V2 is within a predetermined range, for example α<V3/V2<β.

According to embodiments, bias converting unit 220 may include first comparator Comp1, second comparator Comp2, inverter 222, NAND gate 224, bias converting transistor 226, third bias current source 228 and/or first to fourth resistors R1 to R4, respectively. In embodiments, first comparator Comp1 may have a (+) input terminal to which second voltage V2 may be input, and/or a (−) input terminal to which a first divided voltage β×V3 may be input. In embodiments, first divided voltage β×V3 may be a voltage divided from third voltage V3 by first resistor R1 and second resistor R2. In embodiments, β may reference R2/(R1+R2), for example β=R2/(R1+R2). In embodiments, first comparator Comp1 may compare second voltage V2 with first divided voltage β×V3, and/or output first comparison signal C1 based on a result of a comparison.

According to embodiments, second comparator Comp2 may have a (+) input terminal to which third voltage V3 may be input, and/or a (−) input terminal to which second divided voltage α×V2 may be input. In embodiments, second divided voltage α×V2 may be a voltage divided from second voltage V2 by third resistor R3 and fourth resistor R4. In embodiments, a may reference R4/(R3+R4), for example α=R4/(R3+R4). In embodiments, second comparator Comp2 may compare third voltage V3 with second divided voltage α×V2, and/or output second comparison signal C2 based on a result of a comparison.

According to embodiments, first resistor R1 may be connected between a third base and a (−) input terminal of first comparator Comp1. In embodiments, second resistor R2 may be connected between a (−) input terminal of first comparator Comp1 and a ground voltage source. In embodiments, third resistor R3 may be connected between a second base and a (+) input terminal of second comparator Comp2. In embodiments, fourth resistor R4 may be connected between a (+) input terminal of second comparator Comp2 and a ground voltage source.

According to embodiments, inverter 222 may invert second comparison signal C2, and/or output inverted second comparison signal C2'. In embodiments, NAND gate 224 may logically operate first comparison signal C1 and/or inverted second comparison signal C2', and/or may output a result of a logical operation. In embodiments, bias converting transistor 226 may supply to second node N2 third current I3 output from third bias current source 228, for example based on an output from NAND gate 224.

Referring to example FIG. 3, output states are illustrated of first comparator Comp1, second comparator Comp2, and/or bias converting transistor 226 illustrated in FIG. 2. According to embodiments, α and β may always less than approximately 1 since they may be resistance division ratios. In embodiments, a condition that first comparison signal C1 may be in a relatively low state and/or second comparison signal C2 may be in a relatively high state may not be defined. In embodiments, when both first comparison signal C1 and second comparison signal C2 may be in a relatively low state and/or in a relatively high state, a greater and/or smaller one of α and/or 1/β may be negligible. In embodiments, when both first comparison signal C1 and second comparison signal C2 may be in a relatively low state and/or in a relatively high state, an output of NAND gate 224 may have a relatively high level value. In embodiments, where bias converting transistor 226 includes an NMOS transistor, it may be turned off in response to an output of NAND gate 224, which may have a relatively high level value.

Referring to example FIG. 4, an ON-OFF operation range is illustrated of bias converting transistor 226 according to second voltage V2 and third voltage V3. In embodiments, bias converting transistor 226 may be turned on when a ratio of third voltage V3 to second voltage V2 (V3/V2) may be approximately greater than α, but approximately smaller than 1/β. In embodiments, when first comparison signal C1 may have a relatively high level, and/or second comparison signal may have a relatively low level, bias converting transistor 226 may be turned on. In embodiments, it may be possible to define a range within which bias converting transistor 226 may be turned on, for example by adjusting resistance division ratio α and/or β.

According to embodiments, once bias converting transistor 226 may be turned on, current may be supplied to second bias switch Q2 and/or third bias switch Q3. In embodiments, current supplied to second bias switch Q2 and/or third bias switch Q3 may correspond to a sum of second current I2 and third current I3 as third voltage V3 may approximate to second voltage V2. In embodiments, a difference between first emitter-base voltage VEB1 of first bias switch Q1 and second emitter-base voltage VEB2 of third bias switch Q3 may be reduced by third bias current source 228, for example in accordance with Expression 1.

$$VEB1-VEB2=VT \times \ln[(2 \times I2)/(I2+I3)]$$ Expression 1 where VT may reference a temperature constant and/or In may reference a natural logarithm.

Referring to example FIG. 5, a circuit diagram illustrates a 3-input comparator circuit in accordance with embodiments. According to embodiments, 3-input comparator circuit 500 may include first bias current source 202, second bias current sources 204, first bias switch Q1, second bias switch Q2, third bias switch Q3, differential amplifying unit 210 and/or bias converting unit 510. In embodiments, second bias current sources 202, 204, first bias switch Q1, second bias switch Q2, third bias switch Q3 and/or differential amplifying unit 210 may be substantially the same as to those illustrated in FIG. 2.

According to embodiments, bias converting unit 510 may include first comparator Comp1, second comparator Comp2, a switching unit, third bias current source 228 and/or first to fourth resistors R1 to R4, respectively. In embodiments, first comparator Comp1, second comparator Comp2, third bias current source 228 and/or first to fourth resistors R1 to R4 may be substantially the same as those illustrated in FIG. 2.

According to embodiments, a switching unit may supply third current I3 to second node N2, for example based on first comparison signal C1 and/or second comparison signal C2. In embodiments, a switching unit may include first switch 512 and/or second switch 514. In embodiments, first switch 512 and/or second switch 514 may be connected in series between third bias current source 228 and second node N2. In embodiments, first switch 512 may be switched, for example based on an output from first comparator C1, which may include first comparison signal C1. In embodiments, second switch 514 may be switched, for example based on an output from second comparator C2, which may include second comparison signal C2. In embodiments, first switch 512 may include an NMOS transistor, and/or second switch 514 may include a PMOS transistor.

According to embodiments, first switch 512 and second switched 514 may be simultaneously turned on, for example when first comparison signal C1 includes a relatively high level and/or second comparison signal C2 includes a relatively low level. In embodiments, third current I3 may be supplied to second node N2. In embodiments, 3-input comparator circuit 500 may have substantially the same characteristics as illustrated in FIG. 3.

Referring to example FIG. 6, a graph depicts variations in first emitter-base voltage VEB1 and/or third emitter-base voltage VEB3 according to a variation in third voltage V3. According to embodiments, first voltage V1 may be fixed at 350 mV. In embodiments, if a proposed offset compensation may not be applied under a condition that an allowable offset range may be 10 mV, a voltage of up to approximately 345 mV may be used for third voltage V3. In embodiments, where a compensation as illustrated in FIG. 2 and/or FIG. 5 may be applied to third current I3, a voltage of up to approximately 388 mV may be used for third voltage V3. In embodiments, a difference may be as small as approximately 43 mV. In embodiments, when third voltage V3 is a voltage applied according to a resistance division ratio M of a certain voltage, an operation range may be increased M times. In embodiments, M may be approximately 10, 3-input comparator may achieve an enhancement in accuracy and/or secure a relatively wide operating range increased by approximately 430 mV.

According to embodiments, switches and/or logic circuits may be added to a 3-input comparator, which may change bias currents in accordance with an input voltage. In embodiments, operation range may be maximized and/or an enhancement in accuracy. In embodiments, when a proposed offset compensation may be applied to the 3-input comparator, which may be used to realize various functions in a high-performance IC, it may be possible not only to secure a relatively wider operation range, but also to design a comparator having a relatively increased accuracy. In embodiments, it may be possible not only to achieve an enhancement in performance of a comparator, but it may also be possible to achieve an enhancement in a performance of an entirety of a IC.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a differential amplifying unit configured to amplify a difference between a voltage at a first node and a voltage at a second node, and to output a resultant voltage;

a current source configured to supply a first bias current to said first node and supply a second bias current to said second node;

a first bias switch configured to bias a current flowing from said first node to a ground voltage source based on a first voltage;

a second bias switch configured to bias a part of a current flowing from said second node to said ground voltage source based on a second voltage;

a third bias switch configured to bias a remaining part of said current flowing from said second node to said ground voltage source based on a third voltage; and a bias converting unit configured to supply a third bias current to said second node based on said second voltage and said third voltage.

2. The apparatus of claim 1, wherein said differential amplifying unit comprises at least one of a plurality of output loads and a plurality of differential amplifiers.

3. The apparatus of claim 1, wherein said first bias current and said second bias current comprise substantially the same value.

4. The apparatus of claim 1, wherein said bias converting unit is configured to supply said third bias current to said second node when said second voltage and said third voltage are within a predetermined range.

5. The apparatus of claim 1, wherein said bias converting unit comprises:
a first comparator configured to compare said second voltage with a first division voltage divided from said third voltage and to output a first comparison signal based on a result of said comparison;
a second comparator configured to compare said third voltage with a second division voltage divided from said second voltage and to output a second comparison signal based on a result of said comparison;
an inverter configured to invert said second comparison signal;
a NAND gate configured to logically operate said first comparison signal and an output from said inverter, and to output a result of said logical operation; and
a bias converting transistor configured to supply said third bias current to said second node based on an output from said NAND gate.

6. The apparatus of claim 1, wherein said bias converting unit comprises:
a first comparator configured to compare said second voltage with a first division voltage divided from said third voltage, and to output a first comparison signal based on a result of said comparison;
a second comparator configured to compare said third voltage with a second division voltage divided from said second voltage, and to output a second comparison signal based on a result of said comparison; and
a switching unit configured to supply said third current to said second node based on said first and second comparison signals.

7. The apparatus of claim 1, comprising a comparator circuit.

8. An apparatus comprising:
a differential amplifying unit configured to amplify a difference between a voltage at a first node and a voltage at a second node, and to output a resultant voltage;
a first bias switch configured to control a current flowing to a ground voltage source from a first node to which a first current is supplied based on a first voltage;

a second bias switch configured to control a part of a current flowing to said ground voltage source from said second node to which a second current is supplied based on a second voltage;

a third bias switch configured to control a remaining part of a current flowing from said second node to said ground voltage source based on a third voltage; and a bias converting unit configured to supply a third bias current to said second node based on said second voltage and said third voltage.

9. The apparatus of claim 8, wherein said differential amplifying unit comprises at least one of a plurality of output loads and a plurality of differential amplifiers.

10. The apparatus of claim 8, wherein:
said first bias switch comprises a bipolar transistor connected between said first node and said ground voltage source while having a first base to which said first voltage is applied;
said second bias switch comprises a bipolar transistor connected between said second node and said ground voltage source while having a second base to which said second voltage is applied;
said third bias switch comprises a bipolar transistor connected between said second node and said ground voltage source while having a third base to which said third voltage is applied.

11. The apparatus of claim 8, wherein said bias converting unit comprises:
a first comparator configured to compare said second voltage with a first division voltage divided from said third voltage, and to output a first comparison signal based on a result of said comparison;
a second comparator configured to compare said third voltage with a second division voltage divided from said second voltage, and to output a second comparison signal based on a result of said comparison;
a logical operating unit configured to logically operate said first and second comparison signals, and to output a result of said logical operation; and
a bias converting transistor configured to supply said third bias current to said second node based on an output from said logical operating unit.

12. The apparatus of claim 8, wherein said bias converting unit comprises a switching unit.

13. The apparatus of claim 8, comprising a comparator circuit.

14. An method comprising:
forming a differential amplifying unit to amplify a difference between a voltage at a first node and a voltage at a second node, and output a resultant voltage;
forming a current source to supply a first bias current to said first node and supply a second bias current to said second node;
forming a first bias switch to bias a current flowing from said first node to a ground voltage source based on a first voltage;
forming a second bias switch to bias a part of a current flowing from said second node to said ground voltage source based on a second voltage;
forming a third bias switch to bias a remaining part of said current flowing from said second node to said ground voltage source based on a third voltage; and
forming a bias converting unit to supply a third bias current to said second node based on said second voltage and said third voltage.

15. The method of claim 14, wherein said differential amplifying unit comprises at least one of a plurality of output loads and a plurality of differential amplifiers.

16. The method of claim 14, wherein said first bias current and said second bias current comprise substantially the same value.

17. The method of claim 14, wherein said bias converting unit is configured to supply said third bias current to said second node when said second voltage and said third voltage are within a predetermined range.

18. The method of claim 14, wherein, said bias converting unit comprises:
- a first comparator configured to compare said second voltage with a first division voltage divided from said third voltage and to output a first comparison signal based on a result of said comparison;
- a second comparator configured to compare said third voltage with a second division voltage divided from said second voltage and to output a second comparison signal based on a result of said comparison;
- an inverter configured to invert said second comparison signal;
- a NAND gate configured to logically operate said first comparison signal and an output from said inverter, and to output a result of said logical operation; and
- a bias converting transistor configured to supply said third bias current to said second node based on an output from said NAND gate.

19. The method of claim 14, wherein said bias converting unit comprises:
- a first comparator configured to compare said second voltage with a first division voltage divided from said third voltage, and to output a first comparison signal based on a result of said comparison;
- a second comparator configured to compare said third voltage with a second division voltage divided from said second voltage, and to output a second comparison signal based on a result of said comparison; and
- a switching unit configured to supply said third current to said second node based on said first and second comparison signals.

20. The method of claim 14, comprising forming a comparator circuit.

* * * * *